(12) United States Patent
Rombach

(10) Patent No.: US 10,484,797 B2
(45) Date of Patent: Nov. 19, 2019

(54) MEMS MICROPHONE HAVING IMPROVED SENSITIVITY AND METHOD FOR THE PRODUCTION THEREOF

(71) Applicant: EPCOS AG, Munich (DE)

(72) Inventor: Pirmin Hermann Otto Rombach, Kongens Lyngby (DK)

(73) Assignee: EPCOS AG, München (DE)

(*) Notice: Subject to any disclaimer, the term of this patent is extended or adjusted under 35 U.S.C. 154(b) by 204 days.

(21) Appl. No.: 15/322,085

(22) PCT Filed: May 18, 2015

(86) PCT No.: PCT/EP2015/060885
§ 371 (c)(1),
(2) Date: Dec. 23, 2016

(87) PCT Pub. No.: WO2015/197262
PCT Pub. Date: Dec. 30, 2015

(65) Prior Publication Data
US 2017/0150277 A1  May 25, 2017

(30) Foreign Application Priority Data

Jun. 23, 2014 (DE) .................. 10 2014 108 740

(51) Int. Cl.
*H04R 19/00* (2006.01)
*H04R 19/04* (2006.01)
(Continued)

(52) U.S. Cl.
CPC ........... *H04R 19/04* (2013.01); *B81B 3/0075* (2013.01); *B81C 1/00531* (2013.01);
(Continued)

(58) Field of Classification Search
CPC .......... B81B 2201/0257; H04R 19/005; H04R 2201/003
See application file for complete search history.

(56) References Cited

U.S. PATENT DOCUMENTS 6,847,090 B2   1/2005  Loeppert
6,859,542 B2   2/2005  Johannsen et al.
(Continued)

FOREIGN PATENT DOCUMENTS

DE        60202145 T2    12/2005
DE    102004045768 A1     4/2006
(Continued)

OTHER PUBLICATIONS

Passi, V. et al., "Anistropic Vapor HF Etching of Silicon Dioxide for Si Microstructure Release," Microelectronic Engineering, Elsevier Publishers BV, Jan. 7, 2012, 7 pages.

*Primary Examiner* — Matthew A Eason
(74) *Attorney, Agent, or Firm* — Slater Matsil, LLP

(57) ABSTRACT

A MEMS microphone with improved sensitivity and a method for producing such a MEMS microphone are disclosed. In an embodiment the MEMS microphone includes a carrier substrate, a capacitor having two electrodes, a substrate-side anchor and an electrode anchor, wherein the substrate-side anchor connects the substrate to the capacitor, wherein the electrode anchor connects the two electrodes of the capacitor, wherein one of the electrodes is a backplate and the other electrode is the anchored membrane, and wherein the substrate-side anchor has a bearing area on the substrate which exceeds a minimum area necessary for a mechanical stability of the MEMS microphone by not more than the minimum area.

5 Claims, 6 Drawing Sheets

(51) Int. Cl.
*B81B 3/00* (2006.01)
*B81C 1/00* (2006.01)
*H04R 31/00* (2006.01)

(52) U.S. Cl.
CPC ......... *H04R 19/005* (2013.01); *H04R 31/006* (2013.01); *B81B 2201/0257* (2013.01); *B81C 2201/0136* (2013.01); *H04R 31/00* (2013.01); *H04R 2201/003* (2013.01)

(56) References Cited

U.S. PATENT DOCUMENTS

| | | | |
|---|---|---|---|
| 8,664,733 | B2 | 3/2014 | Rombach |
| 9,382,109 | B2 | 7/2016 | Johansen et al. |
| 2002/0181725 | A1* | 12/2002 | Johannsen ............. B82Y 30/00 381/174 |
| 2007/0284682 | A1* | 12/2007 | Laming ............... B81C 1/00158 257/416 |
| 2009/0202089 | A1 | 8/2009 | Zhang et al. |
| 2012/0319219 | A1* | 12/2012 | Diamond ............. H04R 19/005 257/416 |
| 2013/0221453 | A1 | 8/2013 | Dehe et al. |
| 2015/0076627 | A1 | 3/2015 | Johansen et al. |
| 2015/0326979 | A1* | 11/2015 | Ravnkilde ............ H04R 19/005 381/355 |

FOREIGN PATENT DOCUMENTS

| | | |
|---|---|---|
| DE | 102010008044 A1 | 8/2011 |
| DE | 102013211943 A1 | 12/2013 |
| JP | 2007295516 A | 11/2007 |
| JP | 2015502692 A | 1/2015 |
| JP | 2015502693 A | 1/2015 |
| WO | 2013071951 A1 | 5/2013 |

* cited by examiner

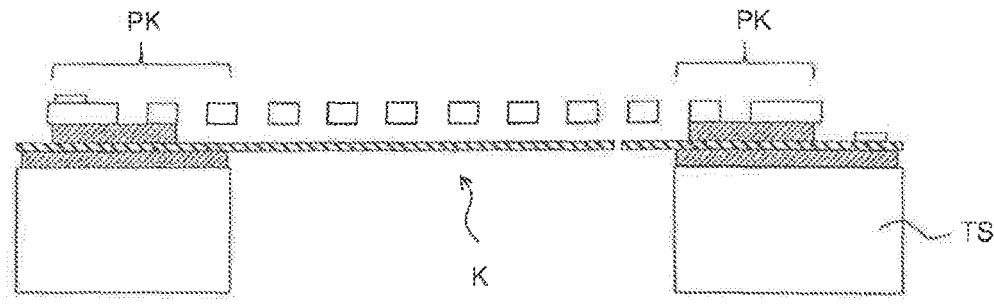
Stand der Technik       Fig. 1
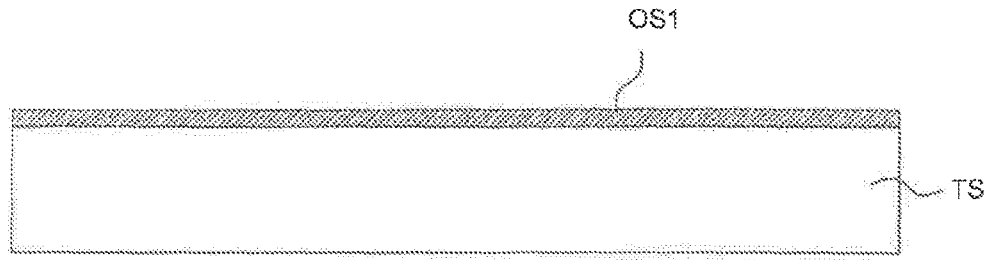
Fig. 2
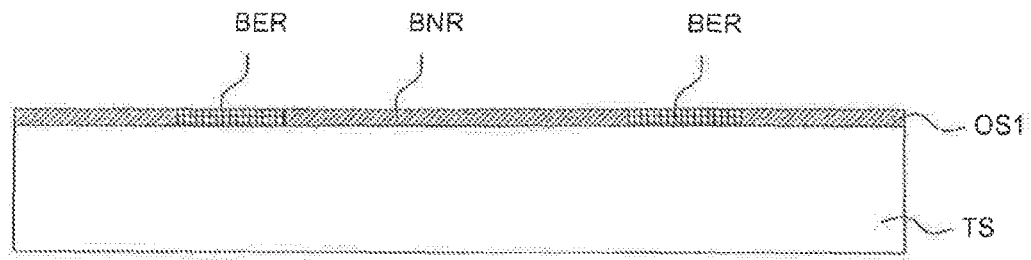
Fig. 3
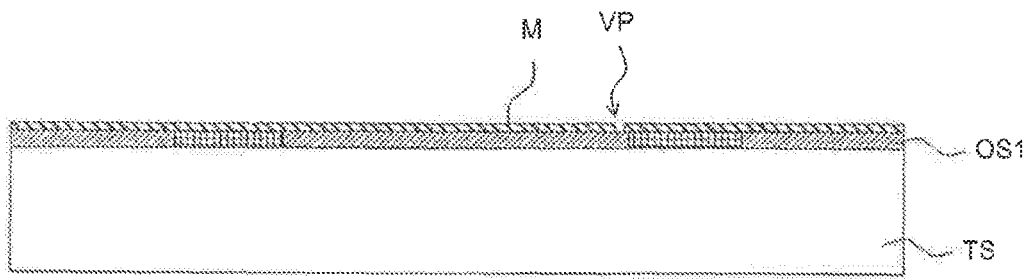
Fig. 4

Stand der Technik

MEMS MICROPHONE HAVING IMPROVED SENSITIVITY AND METHOD FOR THE PRODUCTION THEREOF

This patent application is a national phase filing under section 371 of PCT/EP2015/060885, filed May 18, 2015, which claims the priority of German patent application 10 2014 108 740.2, filed Jun. 23, 2014, each of which is incorporated herein by reference in its entirety.

TECHNICAL FIELD

The invention relates to improved MEMS microphones and methods for the production of such microphones. In this regard, improved microphones having a freely movable membrane and also improved microphones having a fixedly anchored membrane can be obtained.

BACKGROUND

MEMS microphones generally have a capacitor comprising at least one stationary electrode embodied in a planar fashion and having relatively high stiffness, the so-called backplate, and a further electrode embodied in a planar fashion and arranged parallel, the elastic and able to oscillate (oscillatory) membrane (also called diaphragm). In addition, the capacitor can have even further stationary or oscillatory electrodes.

If sound impinges on the capacitor, the one or a plurality of membranes are excited to effect oscillations corresponding to the sound relative to the one or the plurality of backplates. On account of the temporally varying spacings of these capacitor electrodes, the capacitance of the capacitor varies. Evaluation electronics convert the sound-induced capacitance changes into an electrical signal which can be processed further by a circuit environment.

On the one hand, there are MEMS microphones having at least one freely movable membrane. Said membrane is surrounded by mounts such that it can oscillate freely. However, a change in position is possible only to a limited extent. Figure ii shows a schematic illustration of such a MEMS microphone.

On the other hand, there are MEMS microphones having at least one membrane which is anchored such that it can oscillate but substantially cannot alter its position. FIG. 1 shows a schematic illustration of such a MEMS microphone.

It holds true for both types of microphones that their sensitivity and their signal quality can be improved by an acoustically active region of the capacitor having the largest possible area, relative to the acoustically inactive region. This is because the acoustically inactive region of the capacitor contributes to a parasitic capacitance which impairs the signal quality.

In this regard, the document WO2013/071951, for example, discloses MEMS microphones having a reduced parasitic capacitance of the capacitor formed by a membrane and a backplate.

A back volume that is as large as possible is likewise advantageous. In this case, the back volume is the volume which is separated from the surroundings and which is situated behind the capacitor in the sound direction.

However, it is necessary to construct MEMS microphones such that they are as small as possible, which is therefore detrimental to the signal quality.

The LLF (lower limiting frequency) is that frequency which is defined by the 3 dB limit at the lower end of the acoustic frequency band in which a microphone operates. It therefore determines the lower limit of the operating range and is approximately 20 Hz in the case of MEMS microphones having a flat frequency response in the audio range. An LLF that is as small as possible is therefore desirable. A reduced LLF can be achieved by enlarging the back volume, which is difficult to implement on account of the endeavors to achieve ever more extensive miniaturization. A reduced LLF can also be achieved by lengthening the ventilation path which enables a slow pressure equalization between the back volume and the surroundings, which is prevented on account of constraints in production steps.

SUMMARY OF THE INVENTION

Therefore, the objectives are to specify extremely small microphones having an improved signal quality and production methods for such microphones.

These objectives are achieved by means of the subjects of the independent claims. Dependent claims specify advantageous configurations.

The microphones and the production methods are based on the concept of setting lateral dimensions very precisely by means of different etching rates within the same layer. Particularly the etching rates of regions within the same layer which contains a sacrificial material are used for this purpose. At least part of the layer comprising the sacrificial material survives the etching and remains as a structure-imparting element in the microphone. In this regard, in particular lateral dimensions of anchor elements which connect different functional elements of the microphone can be set precisely.

In one embodiment, a MEMS microphone having an anchored membrane has a carrier substrate, a capacitor having two electrodes, a substrate-side anchor and an electrode anchor. The substrate-side anchor mechanically connects the substrate to the capacitor. The electrode anchor mechanically connects the two electrodes of the capacitor. One of the electrodes is a backplate and the other electrode is an oscillatory membrane. The substrate-side anchor has a bearing area on the substrate which exceeds a minimum area necessary for the mechanical stability of the MEMS microphone by not more than a minimum.

The minimum bearing area of the substrate-side anchor on the substrate that is necessary for the mechanical stability is dependent here on the dimensions of the corresponding microphone elements and the expected sound pressure and is accessible via simulations. The bearing area is furthermore that area at which the membrane is fixedly connected to the substrate and therefore cannot oscillate like the "free" regions of the membrane. The region of the membrane at the location of the bearing area thus acts as an acoustically inactive but electrically active region and contributes to the parasitic component of the capacitance, which impairs the signal quality of the microphone. An excessively large bearing area is therefore undesirable. An excessively small bearing area results in a mechanically unstable microphone. The abovementioned minimum defines the safety range necessary for the stability and in this case is smaller than in known MEMS microphones since a mechanically unstable microphone cannot be tolerated and the customary production processes cannot be controlled so as to rule out mechanically unstable microphones.

The size of the bearing area and thus the absolute value of the minimum depend on the manner in which the microphone is produced.

The concept on which the invention is based enables a reduced minimum. This is because the inwardly facing side of the substrate-side anchor can be formed independently of the shape of a cavity in the interior of the substrate.

Said cavity is formed by removing bulk material from the substrate. A DRIE process (deep reactive-ion etching) is usually used owing to the customary thicknesses of the substrate. On account of asymmetries during the process, the removal takes place in a channel running obliquely (See, e.g., FIGS. 8A and 8B). The course of the edge at which the cavity abuts the layers of the membrane and backplate, respectively, is therefore dependent on the direction of the channel, which direction is not freely selectable in practice. However, the position of said edge determines the position of the inner side of the substrate-side anchor during customary etching for the processing steps of the layers of the membrane.

According to the underlying concept here, the dependence of the position of the inner side on the position of the edge is interrupted, such that—independently of the angle of the channel in the substrate—the position of the inner side can be chosen freely. The position of the inner side is no longer coupled to the angle of the channel.

As a result, the minimum is reduced in comparison with customary microphones. The customary microphones cannot comply with the minimum that is now possible.

The use of a material for the substrate-side anchor which contains, on the one hand, sacrificial material and, on the other hand, material which remains as anchor after the removal of the sacrificial material, and which has a locally different etching rate, allows a significantly improved control of the production processes, such that lateral dimensions—such as indeed the bearing area—can be set with high precision. Thus, the additional contribution to the parasitic capacitance is reduced and the signal quality is improved.

It is thus possible for the substrate-side anchor to consist of a material of a sacrificial layer.

It is furthermore possible for the capacitor to be oriented relative to the carrier substrate such that the membrane is arranged between the backplate and the substrate. However, it is also possible for the backplate to be arranged between the membrane and the substrate.

In one embodiment, a MEMS microphone having a non-anchored membrane which is freely movable within a housing has a carrier substrate, a capacitor having two electrodes, a substrate-side anchor and an electrode anchor. One of the electrodes of the capacitor is a backplate having holes, and the other electrode is an oscillatory and freely movable membrane. The substrate-side anchor and the electrode anchor connect the substrate to the backplate. The substrate-side anchor is arranged between the electrode anchor and the substrate. The membrane is arranged between the backplate and the substrate. A ventilation opening is present between the membrane and the two anchors. The backplate directly above the ventilation opening is free of holes.

A MEMS microphone is thus obtained which has a lengthened ventilation path in comparison with customary microphones. A long ventilation path is advantageous for a low LLF. A longer ventilation path can furthermore compensate for a smaller back volume, such that overall a microphone having smaller dimensions can be obtained.

Since—as already described above—the process conditions during the production of conventional microphones cannot be controlled well enough to comply exactly with specific dimensions in etching processes, it holds true that etching processes that last for a short time are preferred in order not to jeopardize the mechanical stability. A layer composed of a sacrificial material is usually arranged between the backplate and the membrane, said sacrificial material being partly removed again by etching after the completion of the capacitor. Since short etching times are preferred, only material that is sufficiently accessible to the etchant can be etched away. Etching away sacrificial material in a topology having nooks and crannies is therefore not possible in a short time. In order to solve this problem, additional holes are therefore provided in the backplate, through which additional holes the etchant can reach the regions of the sacrificial material that are to be removed. However, precisely these holes shorten the ventilation path.

However, the present invention now demonstrates the possibility of removing sacrificial material from topologies having nooks and crannies despite a short etching duration, such that long ventilation paths can be obtained. This is because, by means of locally increasing the etching rate in the material of the sacrificial layer, it is possible to remove the material in a short time, while the short etching duration is insufficient to remove material having a low etching rate, to an extent such that mechanically stabilizing residues that are to remain continue to exist. The anchors can therefore consist of a material—even of the actual sacrificial layer—which has a high resistance to corresponding etchants.

The abovementioned observations and advantages in the positioning of the inwardly facing sides of the substrate-side anchor are likewise applicable.

It is furthermore possible for at least the substrate-side anchor and/or the electrode anchor to consist of a material of a sacrificial layer.

It is possible, in particular, for the substrate-side anchor and/or the electrode anchor to comprise an oxide or a nitride.

It is furthermore possible, in particular, for the substrate-side anchor and/or the electrode anchor to comprise a silicon oxide, e.g., $SiO_2$, or a silicon nitride, e.g., $Si_3N_4$. An anchor material comprising an oxide is preferred.

Oxides or nitrides which deviate from this stochiometric ratio are likewise possible.

Silicon compounds may be preferred since processing steps are well known from the semiconductor industry. In particular the carrier substrate can comprise or consist of Si (silicon).

A method which is suitable for producing such improved microphones is specified below. In this case, the method is not restricted to the production of one type of microphones. In particular microphones having an anchored membrane and having a non-anchored membrane but with improved signal properties can thus be produced easily.

The method comprises the steps of:
providing a carrier substrate,
arranging a lower sacrificial layer on the carrier substrate,
producing a membrane on the sacrificial layer,
arranging an upper sacrificial layer on the membrane,
producing a backplate on the upper sacrificial layer.

In this case, the etching rate of the lower sacrificial layer in a region which is intended to adjoin the later substrate-side anchor and/or an etching rate of the upper layer in a region which is intended to adjoin the later capacitor anchor are/is increased after arranging the corresponding sacrificial layer.

A phase boundary between the regions of the different etching rates thus arises in the sacrificial layer. The phase boundary essentially marks the lateral boundaries of the residues of the layer comprising the sacrificial material that remain after the etching, wherein said residues form the corresponding anchors after the production steps.

It is therefore possible that, after producing the backplate, at least one region of increased etching rate of a sacrificial layer is removed by etching.

It is furthermore possible that the etching rate is an etching rate for etching using the etchant hydrofluoric acid HF in liquid or gaseous (VHF=vapor HF).

The customary etchants for a layer comprising the sacrificial material silicon oxide are possible.

It is possible that the etching rate is increased by ion implantation.

It is possible, in particular, that the etching rate is increased by implantation of P (phosphorus) ions.

BRIEF DESCRIPTION OF THE DRAWINGS

Important aspects of the microphones and of the methods are explained in greater detail below on the basis of schematic figures and schematic exemplary embodiments.

In the figures:

FIG. 1 shows the schematic construction of a conventional MEMS microphone having an anchored membrane together with its disadvantage, the large acoustically inactive region, FIGS. 2 to 9 show different intermediate stages during the production of an improved MEMS microphone having an anchored membrane.

In this case, the figures illustrate intermediate stages with different degrees of structuring. The customary thin-film processes can be used for structuring layers and elements.

DETAILED DESCRIPTION OF ILLUSTRATIVE EMBODIMENTS

FIG. 1 shows a conventional MEMS microphone having a fixedly anchored membrane. That region of the membrane below the backplate which cannot oscillate freely because it is connected to the carrier substrate via an anchor does not contribute to the conversion of an acoustic signal, but rather to the generation of an undesired parasitic capacitance PK. Since the process steps during the production of conventional MEMS microphones cannot be controlled very well, the bearing region of the anchor between membrane and substrate has to be chosen with a large safety latitude.

FIG. 2 shows an intermediate stage in the production of an improved microphone having a reduced parasitic capacitance. A first sacrificial layer OS1 is applied on a carrier substrate TS. In the context of the microphones and methods described here, the term sacrificial layer does not demand that the entire material of the sacrificial layer be removed in later steps. It is also possible for parts of the material to remain and to mechanically connect different elements in the finished microphone.

FIG. 3 shows an intermediate stage in which the first sacrificial layer OS1 is altered in a region of increased etching rate BER such that the etching rate relative to a suitably chosen etchant is increased compared with a region of normal etching rate BNR. A phase boundary between the regions of different rates can later essentially represent the boundary of a remaining residue, e.g., of an anchor.

FIG. 4 shows an intermediate stage in which a monolayer or multilayer, from which the membrane M emerges later, is applied and structured on the first sacrificial layer OS1. A ventilation opening for the later ventilation path VP can be formed during the structuring of said monolayer or multilayer.

Figure 5:
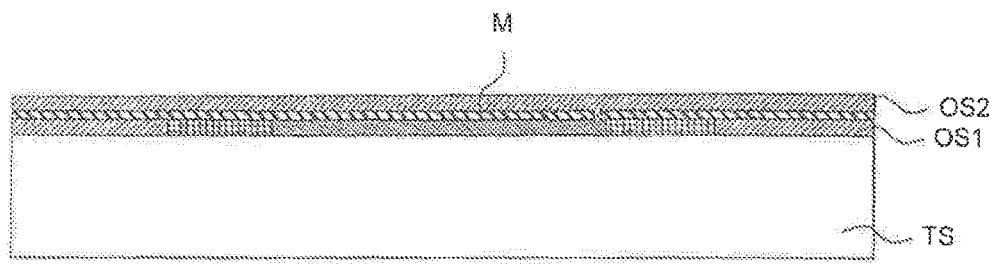

FIG. 5 shows an intermediate stage in which a second sacrificial layer OS2 is deposited on the material of the later membrane M.

Figure 6:
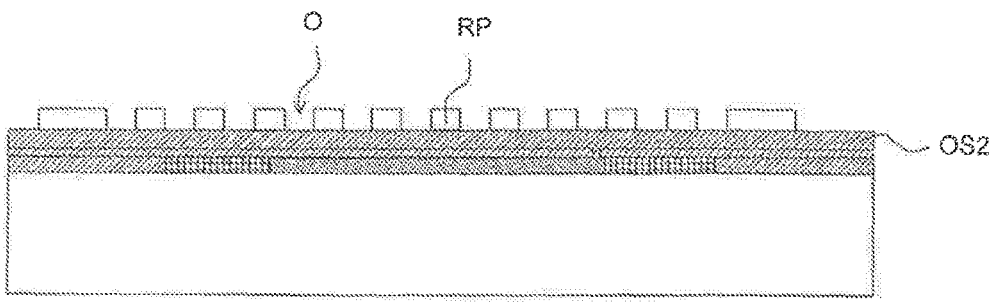

FIG. 6 shows an intermediate stage in which a backplate RP is deposited and structured on the material of the second sacrificial layer OS2. The structuring of the backplate RP also includes the formation of openings O in the plate, through which the sound pressure to be received can pass to the membrane M.

Figure 7:
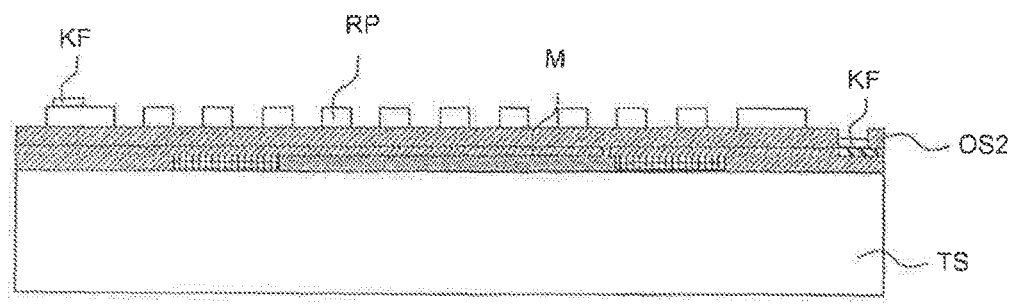
Figure 19:
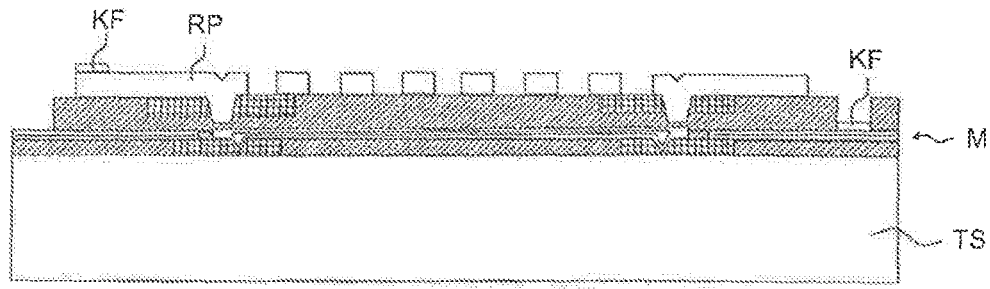

FIG. 7 shows an intermediate stage in which a respective contact pad KF is deposited and structured on the backplate RP and on the later membrane M. For this purpose, a cutout was etched, or produced in some other way, through the second sacrificial layer OS2. A contacting of the membrane is simple—compared with a freely movable membrane as shown in FIG. 19—since the membrane always maintains the same equilibrium position and no gap has to be bridged.

Figure 8A:
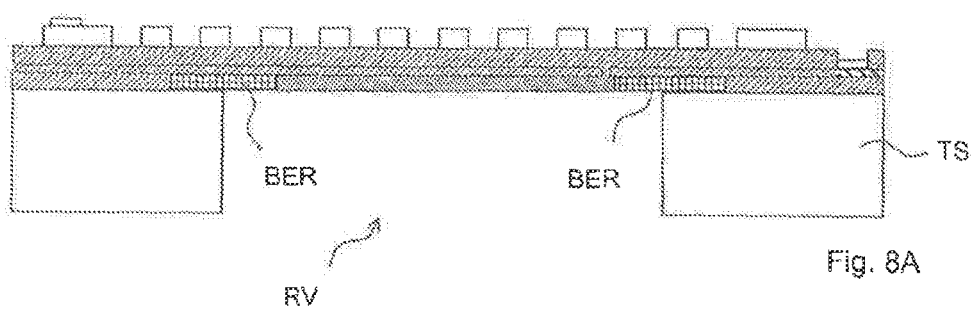
FIGS. 8A, 8B, 8C show different etching directions when forming the back volume and the effect of the direction on the inner side of the substrate-side anchor.

FIG. 8A shows an intermediate stage with a possible form of the back volume which was formed by structuring along an orthogonal direction relative to the underside of the carrier substrate.

Figure 8B:
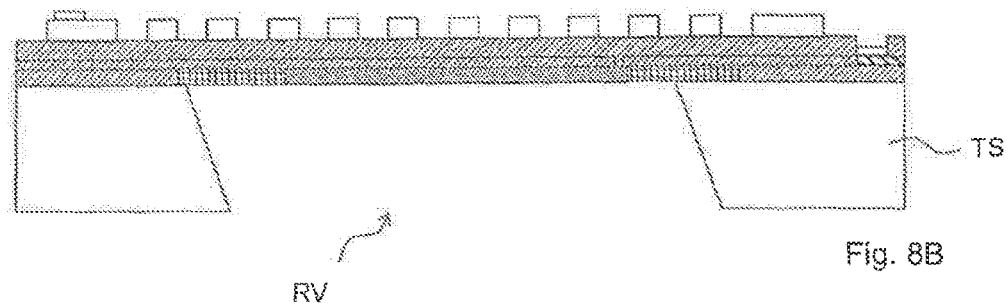

FIG. 8B shows an intermediate stage with an alternative form of the back volume which was formed by structuring along a direction deviating from 90 degrees.

Figure 8C:
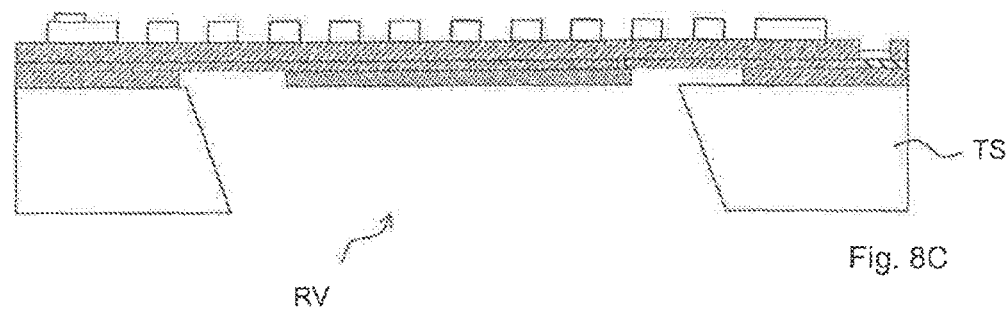

FIG. 8A illustrates schematically here the desired state of a perpendicular channel through the substrate, which is not obtained in practice. FIG. 8B illustrates the normal state since asymmetries during production cause an obliquely running channel. The fact that a varying etching rate is chosen then makes it possible to interrupt the dependence of the position of the inwardly facing side of the substrate-side anchor on the direction of the channel, as shown in FIG. 8C: the inwardly facing edge can be further away from the edge of the substrate on the right-hand side compared with on the left-hand side. The dependence on the orientation of the channel is interrupted.

The customary structuring methods such as RIE (reactive-ion etching), DRIE and the like are appropriate for structuring the volume.

Figure 9:
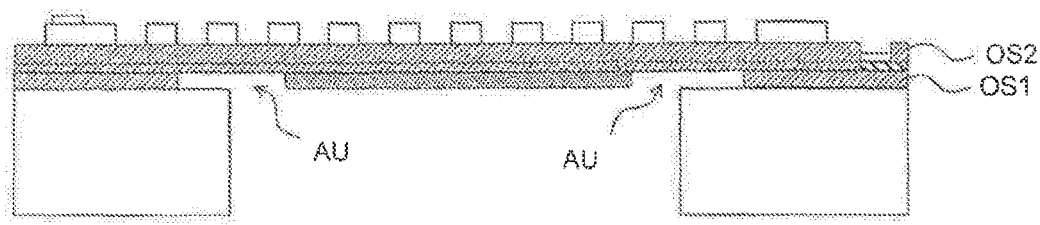

FIG. 9 shows an intermediate stage in which the material of the first sacrificial layer OS1 in the regions of increased etching rate BER was removed substantially without residues in a short time despite a possible complicated topology having nooks and crannies, without severely attacking the rest of the materials.

Figure 10:
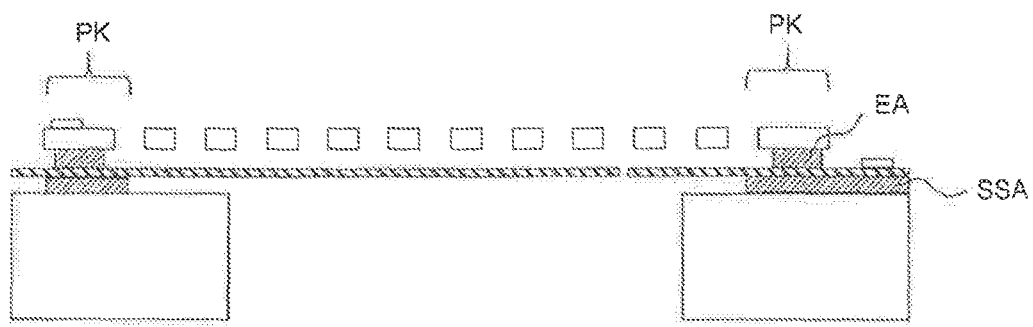
FIG. 10 shows a stage in which the capacitor is formed with almost minimal parasitic capacitance.

FIG. 10 shows a stage of the microphone in which all regions of the sacrificial layers OS1, OS2 that are to be removed have been removed. The parasitic capacitances PK are minimal since the safety latitude in the case of the width of the bearing area of the substrate-side anchor SSA on the carrier substrate virtually disappears.

Figure 11:
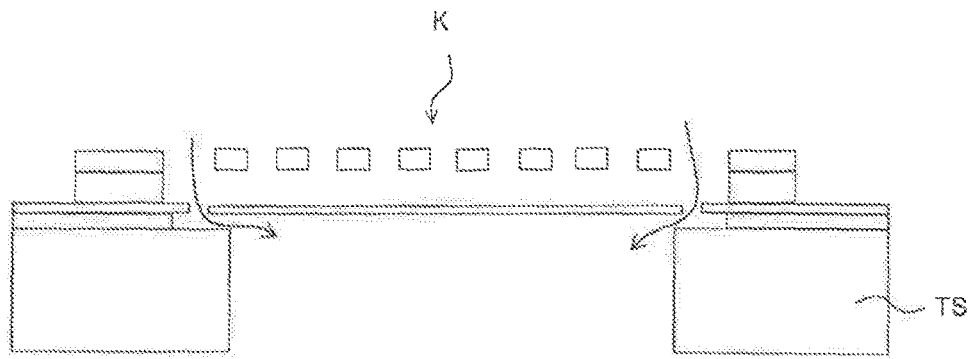
FIG. 11 shows the schematic construction of a conventional MEMS microphone having a displaceable membrane together with its disadvantage, the short ventilation path.

FIG. 11 schematically shows the construction of a conventional MEMS microphone having a displaceable membrane, in which a capacitor is arranged above a carrier substrate. The capacitor has a backplate having holes. The membrane is surrounded in a lateral direction by a substantially ring-shape gap via which the separation of the back volume below the membrane from the surroundings of the microphone is bridged. In this regard, a low-frequency pressure equalization can take place. The LLF decreases with increasing resistance to which a pressure-equalizing amount of air is exposed. The ventilation path is essentially the path taken by the air. The resistance increases as the length of the ventilation path increases. The LLF thus decreases as the length of the path increases.

Since the membrane can be extracted from the material of one or more sacrificial layers to a sufficient extent during production only if the etching material has direct access to the sacrificial material in the case of a short etching duration, openings in the backplate directly above the (ventilation) gap are necessary, as a result of which, however, the ventilation path is shortened and the resistance is reduced.

Figure 12:
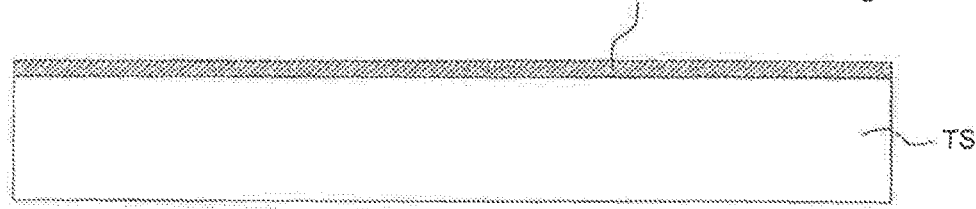
FIGS. 12 to 21 show different intermediate stages during the production of an improved MEMS microphone having a displaceable membrane.

FIG. 12 shows—analogously to FIG. 2—an intermediate stage during the production of an improved microphone. A first sacrificial layer OS1 is applied on a carrier substrate TS.

Figure 13:
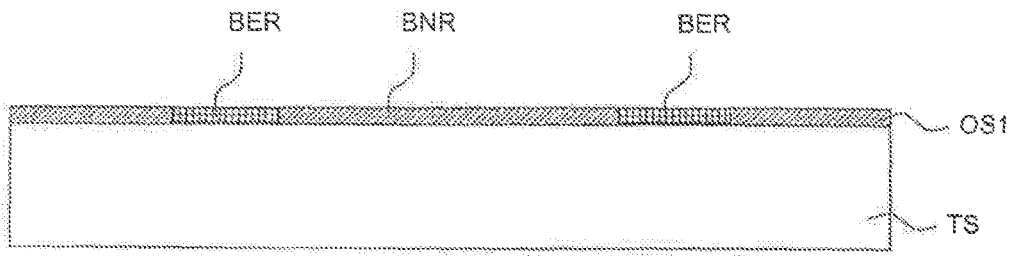

FIG. 13 shows—analogously to FIG. 3—an intermediate stage in which the first sacrificial layer OS1 is altered in a region of increased etching rate BER such that the etching rate in relation to a suitably chosen etchant is increased compared with a region of normal etching rate BNR. A phase boundary between the regions of different rates can later essentially represent the boundary of a remaining residue, e.g., of an anchor.

Figure 14:
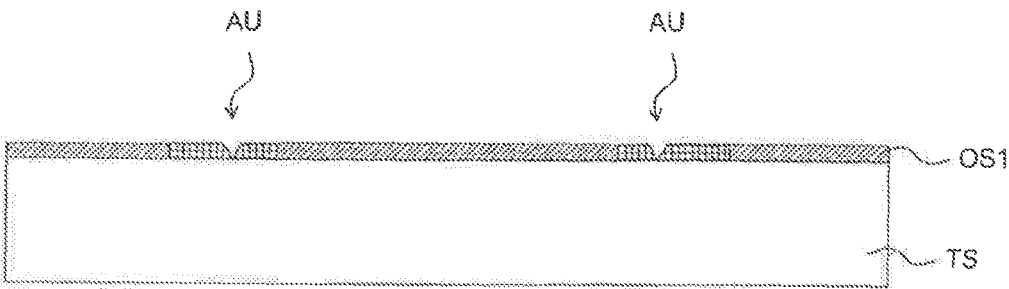

FIG. 14 shows an optional step in which cutouts AU are structured into the material of the first sacrificial layer OS1. In this case, the shape of the cutouts AU determines the shape of later tips of the membrane by which adhesion of the membrane, e.g., to the carrier substrate, is reduced.

Figure 15:
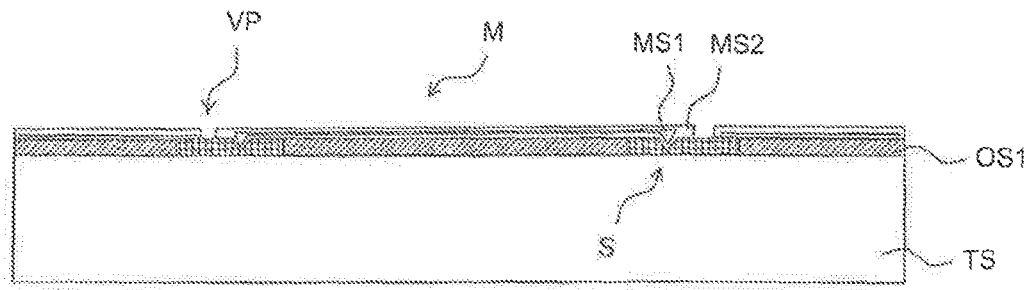

FIG. 15 shows an intermediate stage in which the material of the later membrane M is deposited and the lateral dimensions of the membrane M are defined. In this regard, part of the ventilation path VP is structured by a ring-shaped slot in the material of the layer of the later membrane M. The membrane itself can comprise different layers MS1, MS2, the thickness and materials of which are selected with regard to their tasks—electrical conductivity, mechanical properties . . . —and which are arranged one above another or one in another.

Figure 16:
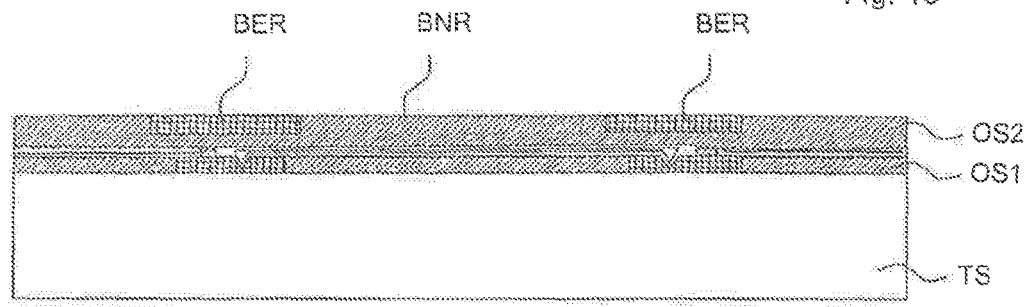

FIG. 16 shows an intermediate stage in which a further material of a second sacrificial layer OS2 is arranged on the material of the membrane. Analogously to the first sacrificial layer OS1, the etching rate is increased in local regions BER compared with the unaltered material in regions of "normal" rate BNR.

The embodiment shown has regions of increased etching rate BER in the first OS1 and in the second OS2 sacrificial layer. In this case, for alternative embodiments it may suffice if only the first OS1 or the second OS2 sacrificial layer has such regions.

Figure 17:
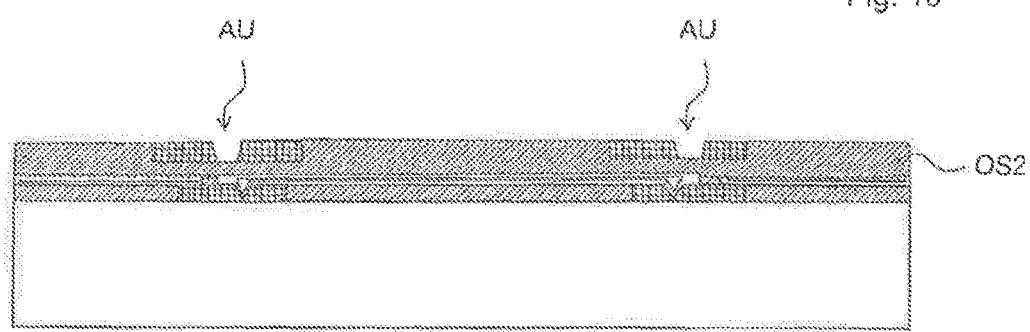

FIG. 17 shows an intermediate stage in which further cutouts AU are structured in the second sacrificial layer OS2. In this case, the shape of said cutouts AU essentially determines the shape of elevations in the later backplate which are directed toward the membrane and likewise effectively prevent adhesion of the membrane to the backplate and determine the equilibrium distance between membrane and backplate.

Figure 18:
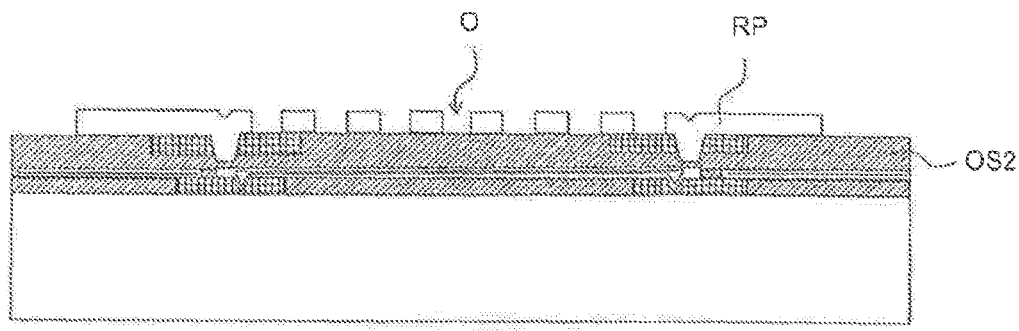

FIG. 18 shows an intermediate stage in which the backplate RP is essentially arranged and structured to the greatest possible extent on the second sacrificial layer OS2. In this case, the structuring of the backplate also comprises the formation of openings O in the backplate through which a sound pressure can act on the membrane.

Formation of openings directly above the later ventilation path section through the membrane is dispensed with, in order to lengthen the ventilation path. The material of the sacrificial layers OS1, OS2 that is to be removed can be removed in a short time despite the topology having nooks and crannies on account of the increased etching rate.

FIG. 19 shows an intermediate stage in which contact pads KF are formed on backplate RP and material of the layer with the membrane M. In order that the membrane and the contact pad to be interconnected therewith are electrically contacted, bridges (not shown here in the cross section) are possible which bridge the gap surrounding the membrane.

Figure 20:
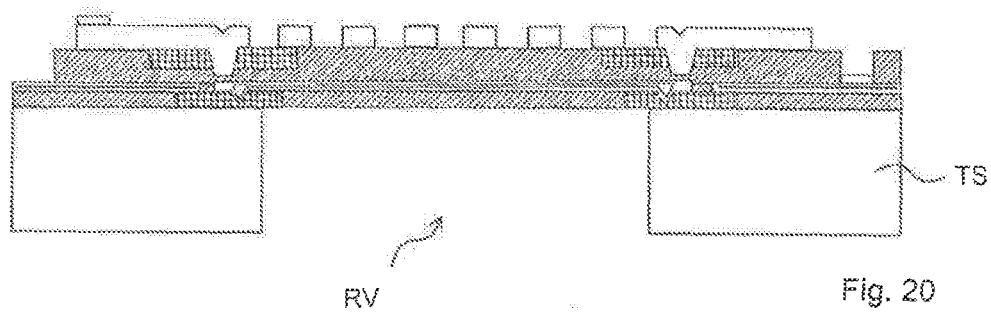

FIG. 20 shows an intermediate stage in which the opening is formed in the silicon material RV in the carrier substrate TS. The opening can later form a back volume or a front volume, depending on installation technology. The customary structuring methods are appropriate for the formation thereof. In particular RIE (reactive-ion etching), DRIE (deep reactive-ion etching) and the like are possible. In this case, the etching direction can be orthogonal or oblique with respect to the perpendicular of the underside of the carrier substrate TS.

The actual back volume RV can be acoustically sealed later by a back-side cover, e.g., a lid. An acoustic sealing can also be effected by applying the microphone to a further carrier. Such acoustic sealing is generally desirable in order that the function of the microphone is not impaired by a so-called acoustic short circuit.

Figure 21:
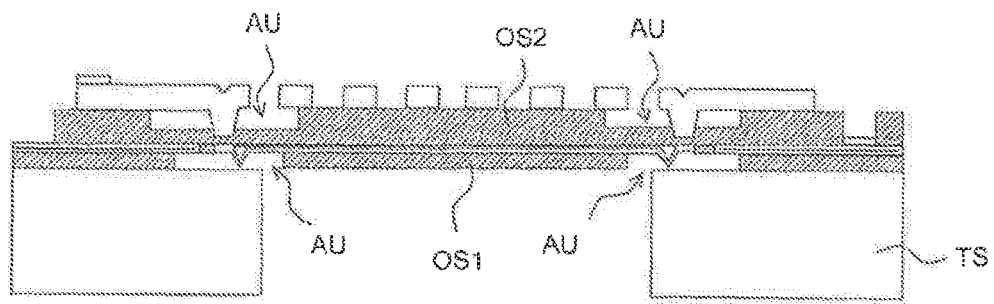

FIG. 21 shows an intermediate stage in which the material of the sacrificial layers OS1, OS2 in the regions of increased etching rate BER was practically completely removed despite a topology having nooks and crannies after an etching step having only a relatively short duration, and the phase boundaries were exposed. This intermediate stage forms an ideal initial basis for the subsequent etching step in which the still remaining regions to be removed are etched away. Primarily in the region of the ventilation path VP, the accessibility to the regions of normal etching rate is so poor that these regions are virtually not attacked.

Figure 22:
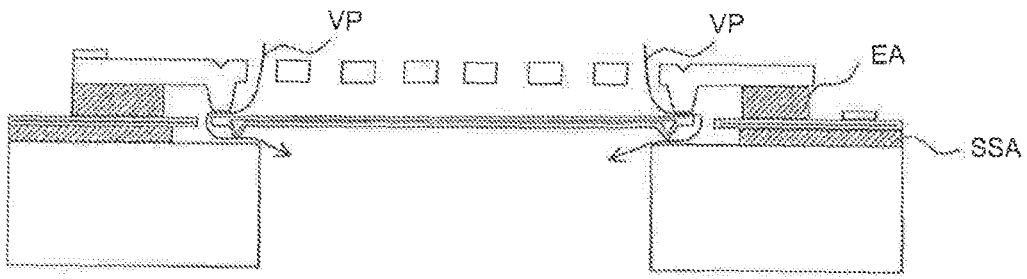
FIG. 22 shows a stage in which the capacitor is formed with a long ventilation path.

FIG. 22 correspondingly shows a stage of the production process in which the membrane is exposed such that it can move freely within its housing afforded by the substrate and the backplate. In this case, the remaining regions of normal etching rate of the sacrificial layers OS1, OS2 form the anchors which hold together the backplate, the—freely movable-membrane and the substrate. The remaining region of the first sacrificial layer OS1 forms the substrate-side anchor SSA, which connects the capacitor to the substrate. The remaining region of the second sacrificial layer OS2 forms the electrode anchor EA, which connects the two electrodes of the capacitor.

Neither the microphones nor the production methods are restricted to the exemplary embodiments or schematic figures shown. The microphones can comprise even further layers, membranes, backplates, logic circuits in ASICs etc. (Application Specific Integrated Circuit). The methods can comprise even further steps for forming such elements.

LIST OF REFERENCE SIGNS

AU: Cutout
BER: Region of increased etching rate
BNR: Region of normal etching rate
EA: Electrode anchor
K: Capacitor
KF: Contact pad M: Membrane
MS1: First membrane layer
MS2: Second membrane layer
O: Opening
OS1: First sacrificial layer
OS2: Second sacrificial layer
PK: Parasitic capacitance
RP: Backplate
RV: Back volume
SSA: Substrate-side anchor
TS: Carrier substrate
VP: Ventilation path

The invention claimed is:

1. A method for producing a MEMS microphone, the method comprising:
   providing a carrier substrate;
   arranging a lower sacrificial layer on the carrier substrate;
   producing a membrane on the lower sacrificial layer;
   arranging an upper sacrificial layer on the membrane; and
   producing a backplate on the upper sacrificial layer,
   wherein an etching rate of the lower sacrificial layer in a region which is intended to adjoin a later substrate-side anchor and/or an etching rate of the upper sacrificial layer in a region which is intended to adjoin a later capacitor anchor are/is increased after arranging the corresponding sacrificial layer.

2. The method according to claim 1, wherein, after producing the backplate, at least one region of increased etching rate of a sacrificial layer is removed by etching.

3. The method according to claim 1, wherein the etching rate is an etching rate for etching using an etchant HF or VHF.

4. The method according to claim 1, wherein the etching rate is increased by ion implantation.

5. The method according to the claim 1, wherein the etching rate is increased by implantation of P ions.

* * * * *

UNITED STATES PATENT AND TRADEMARK OFFICE
CERTIFICATE OF CORRECTION

| | | |
|---|---|---|
| PATENT NO. | : 10,484,797 B2 | Page 1 of 1 |
| APPLICATION NO. | : 15/322085 | |
| DATED | : November 19, 2019 | |
| INVENTOR(S) | : Rombach | |

It is certified that error appears in the above-identified patent and that said Letters Patent is hereby corrected as shown below:

On the Title Page

Item (73) Assignee, Line 1, delete "EPCOS AG, München (DE)" and insert --TDK CORPORATION, Tokyo (JP)--.

Signed and Sealed this
Twenty-eighth Day of July, 2020

Andrei Iancu
*Director of the United States Patent and Trademark Office*